United States Patent
Solden et al.

(10) Patent No.: US 7,069,204 B1
(45) Date of Patent: Jun. 27, 2006

(54) METHOD AND SYSTEM FOR PERFORMANCE LEVEL MODELING AND SIMULATION OF ELECTRONIC SYSTEMS HAVING BOTH HARDWARE AND SOFTWARE ELEMENTS

(75) Inventors: Sherry Solden, Palo Alto, CA (US); Edwin A. Harcourt, Townsend, MA (US); William W. La Rue, Jr., Leawood, KS (US); Douglas D. Dunlop, Potomac, MD (US); Christopher Hoover, Los Gatos, CA (US); Qizhang Chao, Palo Alto, CA (US); Poonam Agrawal, Sunnyvale, CA (US); Aaron Beverly, Los Gatos, CA (US); Massimiliano L. Chiodo, Berkeley, CA (US); Neeti K. Bhatnagar, San Jose, CA (US); Soumya Desai, Calcutta (IN); Hungming Chou, Pleasanton, CA (US); Michael D. Sholes, Redwood City, CA (US); Sanjay Chakravarty, Delhi (IN); Eamonn O'Brien-Strain, San Mateo, CA (US); Luciano Lavagno, Berkeley, CA (US)

(73) Assignee: Cadence Design System, Inc., San Jose, CA (US)

( * ) Notice: Subject to any disclaimer, the term of this patent is extended or adjusted under 35 U.S.C. 154(b) by 903 days.

(21) Appl. No.: 09/670,911

(22) Filed: Sep. 28, 2000

(51) Int. Cl.
*G06F 17/50* (2006.01)

(52) U.S. Cl. .............................. 703/14; 716/7
(58) Field of Classification Search ............... 703/14; 716/7
See application file for complete search history.

(56) References Cited

U.S. PATENT DOCUMENTS

| | | | | |
|---|---|---|---|---|
| 5,544,067 | A | * | 8/1996 | Rostoker et al. ............ 703/14 |
| 5,870,588 | A | | 2/1999 | Rompaey et al. |
| 6,026,219 | A | | 2/2000 | Miller et al. |
| 6,052,524 | A | * | 4/2000 | Pauna ......................... 703/22 |
| 6,132,109 | A | * | 10/2000 | Gregory et al. ............ 717/131 |
| 6,205,407 | B1 | * | 3/2001 | Testa et al. ................. 702/119 |
| 6,438,514 | B1 | * | 8/2002 | Hill et al. .................... 703/17 |

OTHER PUBLICATIONS

Li, J.J. (1998) "Performance Prediction Based on Semi-Formal Software Architectural Description," *Performance, Computing and Communications, IEEE International* pp. 193-199.

Lajolo, M. et al. (1998) "A Case Study on Modeling Shared Memory Access Effects During Performance Analysis of HW/SW Systems," *Hardware/Software Codesign, Proc. of the 6th International Workshop on Hardware/Software Codesign*, pp:15-18.

Lahiri, K. et al. (1999) "Fast Performance Analysis of Bus-Based System-on-Chip Communication Architectures," *International Conference on Computer Aided Design, Proc. of the 1999 International Conference on Computer-Aided Design*, pp. 566-573.

(Continued)

*Primary Examiner*—Paul L. Rodriguez
*Assistant Examiner*—Dwin M. Craig
(74) *Attorney, Agent, or Firm*—John Carpenter; ReedSmith,LLP

(57) ABSTRACT

A method and system for evaluating performance level models of electronic systems having both hardware and software components is provided. The system and method allow for the simplified implementation and testing of several different architectural designs for compliance with the desired operational requirement of a designed electronic system.

29 Claims, 9 Drawing Sheets

OTHER PUBLICATIONS

Yoo, S. et al. (2000) "Performance Estimation of Multiple-Cache IP-based Systems: Case Study of an Interdependency Problem and Application of an Extended Shared Memory Model," *International Conference on Hardware Software Codesign, Proc. of the 8th International Workshop on Hardware/Software Codesign*, pp: 77-81.

* cited by examiner

METHOD AND SYSTEM FOR PERFORMANCE LEVEL MODELING AND SIMULATION OF ELECTRONIC SYSTEMS HAVING BOTH HARDWARE AND SOFTWARE ELEMENTS

BACKGROUND

1. Field of the Invention

The present invention relates generally to designing and evaluating performance level models of electronic systems and amongst other things to a method and system for creating and simulating models of electronic systems at the system level.

2. Background of the Invention

In the traditional electronic system design process, behavior and architecture specification are followed by hardware and software design. The opportunity to consider tradeoffs in function and architecture performance occurs too late in the design flow for any changes to be made in either a timely or cost-effective manner.

The design process of the products for these systems is subject to a number of constraints. A first constraint is that they must be implemented in silicon or another hardware platform for power, performance and cost reasons. A second constraint is that these products implement systems conceived by a highly specialized system team thinking in terms of executable concurrent programming paradigms which, today, are not well understood by hardware designers. In fact, in most systems the partitioning of functions between hardware and software is based upon designer's past experience and is not subject to any analysis. Then, the partitioned specifications are translated into a specific hardware description language (HDL) such as Very High Speed Integrated Circuit (VHSIC) Hardware Description Language (VHDL) or Verilog for the hardware components and a software description language such as C or assembler for the software components. Although the hardware and software have tight interaction, both hardware and software are designed separately. Only after the system is assembled is the software and hardware run together. As a consequence, the design can be far from optimal or even erroneous, making a redesign cycle mandatory.

This gap between system design and implementation is rapidly becoming the most problematic bottleneck in the design process of such products and systems. At the same time the conditions of the marketplace have created a need to quickly design products because of time to market requirements. Therefore, as the design time grows the time allowed for design in the business cycle continuously decreases. A major approach to shortening the design time is by attempting to implement hardware/software co-design procedures, so that the hardware and software of a system can be concurrently designed in order to speed up the design process. However, efficient co-design methodologies and approaches have not been easy to conceive or implement. One of the reasons for this is that the methodologies for hardware design and software design have their own approaches that are difficult to mesh.

Several approaches have been attempted to create a true co-design methodology. One known approach is a co-verification approach, where designed hardware and software are verified together utilizing a co-verification simulator. A problem with this approach is that all the hardware must be built and designed to the cycle accurate level at this point, and therefore any problems that arise during co-verification, if they can be addressed by redesigning the hardware, are difficult to implement as the hardware has already been designed and implemented. Similarly, the software for the system needs to be compiled prior to co-verification.

Another approach to co-design is by instruction set (ISS) co-simulation. This approach concurrently simulates the instruction sets for a processor and related components by utilizing an HDL description of the system and a model of the instruction set. While this can lead to an effective co-simulation, this approach still utilizes a model of the hardware that is functionally complete making it difficult to replace or substantially redesign any hardware components. This approach also requires a complicated processor model which is difficult to create and thus provides a high barrier to exploration of various processors. This approach too results in hardware over-design, with the related higher costs, power consumption, and equipment sizes in systems.

Therefore, there is a need for a hardware/software co-design methodology that allows for simulation at a level where the hardware is not yet completely designed, to allow simple redesign of the hardware components.

Another issue in the design of digital systems is the ability to reuse components that were used in previously designed systems. The design process for a digital system must allow for the reuse of components, and therefore support a reusable design methodology. The problem in reusing previously designed components lies in the fixed communication protocols they use, which necessitates protocol conversions when different components with different protocols have to be interfaced. In fact, it has been noted that more than half of all designs are reused in building future systems.

Today, the selection of a protocol is done while designing the component: functional and communication behavior are intrinsically mixed. However, a good selection of the protocol is possible only when all components involved in the communication are known. Therefore, a design environment for digital systems should permit a component to be initially described in purely functional terms. Later, when the component is (re)used in a system, the design environment must allow to plug in the most appropriate communication behavior. This approach is in contrast with current hardware design practices, where communication and functional behavior are mixed.

The ability to reuse components requires component modularity. In modular designs, the complete system functionality is split into communicating components of manageable complexity. The advantage of this approach is that the components can be reused and that the system is easier to adapt and maintain.

Additionally, the following requirements should be considered for a hardware/software system design environment. (1) modularity is essential to reduce complexity; (2) multiple description languages should be accommodated to allow each system component to be described within the most appropriate paradigm; (3) the design environment must be able to model the heterogeneous conceptual specification, the resulting heterogeneous architecture and all refinement steps in between; and (4) off-the-shelf components and the associated design environments should be modeled.

SUMMARY OF THE INVENTION

The present invention is directed toward a method and system of generating and evaluating performance level models of electronic systems having both hardware and software components. The present invention provides a simplified method for allowing system designers to specify the functional components of their systems and then utilizing the specified components to map and evaluate the mapped model of the system.

In one embodiment, the present invention is directed toward a method of modeling an electronic system having both hardware and software elements. The method comprises generating a plurality of behaviors, associating each of the behaviors of the plurality of behaviors to an appropriate architectural component, and generating communication patterns between the architectural components that require communication between them in order to perform the behaviors.

In another embodiment, the present invention is directed toward a system for creating a behavioral model of an electronic system having hardware and software components. The system comprises a plurality of architectural components, each corresponding to a component capable of being implemented as part of the electronic system, and means for generating communication patterns between the architectural components that require communication between them in order to perform user specified behaviors.

In a further embodiment, the present invention is directed toward a performance level model of an electronic system having hardware and software elements. The model comprises an input function that provides input information, a first service that represents a function to be performed by a first architectural component of the electronic system, a second service that represents a function to be performed by a second architectural component of the electronic system, at least one application programming interface that facilitates communication between the first service and the second service, and an output function that receives output information of the performance level model of the electronic system.

It is an object of an aspect of the present invention to provide system level simulation functionality to allow a designer to work at high levels of abstraction and with larger, more complex circuits and systems.

It is a further object of an aspect of the present invention to provide a technique to easily implement and test several different architectural designs for compliance with the desired operational requirements of a designed system.

It is another object of an aspect of the invention to raise the level of design validation to a system level.

It is an additional object of an aspect of the invention to provide a more standardized design environment, thereby alleviating the need for cross-training between different design platforms and allowing resources to be directed more towards design and implementation.

It is yet another object of an aspect of the invention to provide an intuitive and interactive technique for designing complex digital systems.

It is yet a further object of an aspect of the present invention to provide a technique for allowing high level iterative refinement of a complex digital system design.

It is therefore an advantage of the invention to provide a method of modeling an electronic system having both hardware and software elements, the method comprising capturing a plurality of behaviors that correspond to operations performed by the system being modeled, capturing a plurality of hardware and software architectural components the plurality being contained within an architectural platform, mapping each of the captured behaviors of the plurality of behaviors to a selected architectural component to perform the behavior, recognizing and capturing communication patterns among the architectural components that require communication among them in order to perform the behaviors, and mapping each instance of communication between behaviors to an instance of the captured pattern.

Another advantage of the invention is to provide a system for creating a behavioral model of an electronic system having hardware and software components, the system comprising a plurality of architectural components, each of the architectural components corresponding to a component capable of being implemented as part of the electronic system, and means for generating communication patterns between the architectural components that require communication between them in order to perform user specified behaviors, each communication pattern including communication between any intervening architectural components needed to communicate between architectural components carrying out the behaviors.

Still another advantage of the invention is to provide a performance level model of the communications between behaviors of an electronic system having hardware and software components, the model comprising an application programming interface on one behavior that provides data to be transferred to one or more destination behaviors, a first service that implements the application interface which models the performance of the communication protocol, the service being among a plurality of services supported by the pattern to which the behavior communication is mapped, one or more application programming interfaces by the first service to model the performance of the architecture platform, the application interfaces being among a plurality of service declarations supported by the symbol of the architectural component to which the first behavior is mapped, a supported service declaration on the symbol of the architecture component that is implemented by a service definition, the service definition being among a plurality of service definitions specified by the performance model of the architecture component, a second application interface that represents a function to be performed by a second architectural component topologically connected to the first component of the electronic system, the second service being one a plurality of second services each corresponding to a function capable of being performed by the second architectural component, and an input application interface on the destination behavior that receives output information of the performance level model of the electronic system, thereby completing the communication from source behavior to destination behavior.

BRIEF DESCRIPTION OF THE DRAWINGS

The aforementioned advantages of the present invention as well as additional advantages thereof will be more clearly understood hereinafter as a result of a detailed description of a preferred embodiment of the invention when taken in conjunction with the following drawings.

Figure 1:
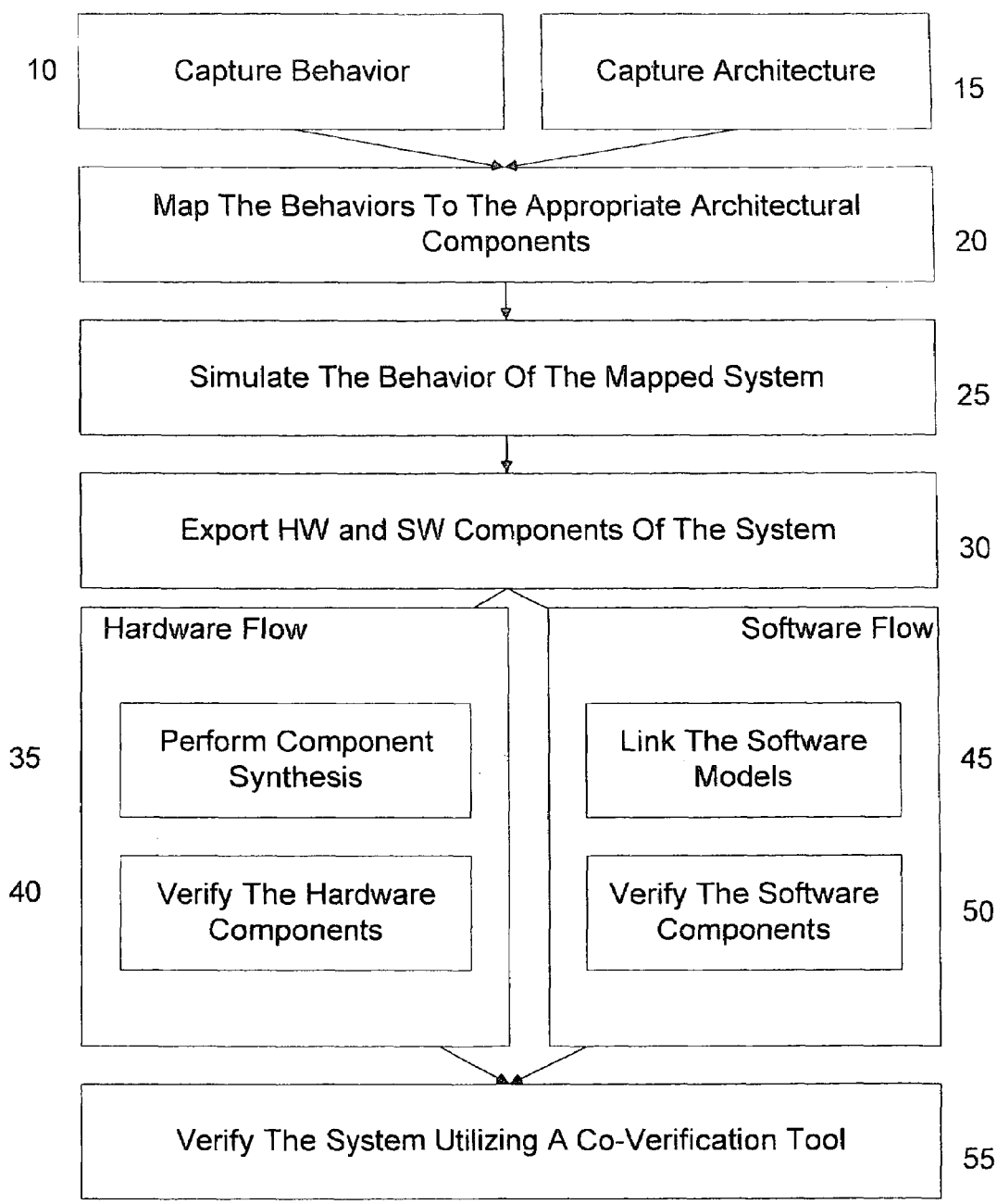
FIG. 1 is a flow chart of a design process according to a presently preferred embodiment of the present invention.

While the invention is susceptible to various modifications and alternative forms, specific embodiments thereof have been shown by way of example in the drawings and will herein be described in detail. It should be understood, however, that the detailed description is not intended to limit the invention to the particular forms disclosed. On the contrary, the intention is to cover all modifications, equivalents, and alternatives falling within the spirit and scope of the invention as defined by the appended claims.

DESCRIPTION OF THE DRAWINGS

The present invention allows the user to clearly differentiate between a behavior model, which identifies what the system does, and an architecture model, which identifies the components that implement the system. This clear differentiation between system function and architecture allows system designers to simulate the performance effects of a behavior running on a number of different architectures early in the design cycle.

In designing a system having both hardware and software elements there are several important factors that should be analyzed. Such things include the execution delay behavior of the system processor(s), the overhead and functionality of the scheduler of the operating system, the execution delay of any system application specific integrated circuit (ASIC) or on-chip custom hardware, the communication paths and timing between hardware and software components, delays with respect to bus and memory access, and timing for instruction and data fetching. In addition, contention problems between resources can also be obtained from system level simulations and therefore dealt with early in the design process.

Referring to FIG. 1, a user inputs the desired system behavior, step 10. The user then inputs the architecture components that implement the system, step 15. The behaviors that the user has input are then mapped to the appropriate architectural components, step 20. Once the behaviors are mapped to the architectural components the performance of the mapped system can be simulated, step 25. The performance simulation determines, for a particular mapped design, whether the timing of the system meets the user's requirements. If not, the user can map portion of the behavioral blocks to different architectural blocks, possibly causing their implementation to move between hardware and software. The design may be a system-on-a-chip with embedded processors, memories, and custom hardware, or it may be composed of discrete processors, memories, and Systems On A Chip (SOCs). When the design is at the fully refined level and its performance meets the system requirements, the user can export it as a software and hardware implementation, step 30. The hardware design will then be ready for HDL simulation, floor planning, and logic synthesis, step 35. The software models will be ready for linking to an RTOS, step 4. The hardware and software components can then both be separately verified, steps 45 and 50. Additionally the hardware and software components of the exported design will be able to be verified together in a co-verification tool, step 55.

Figure 2:
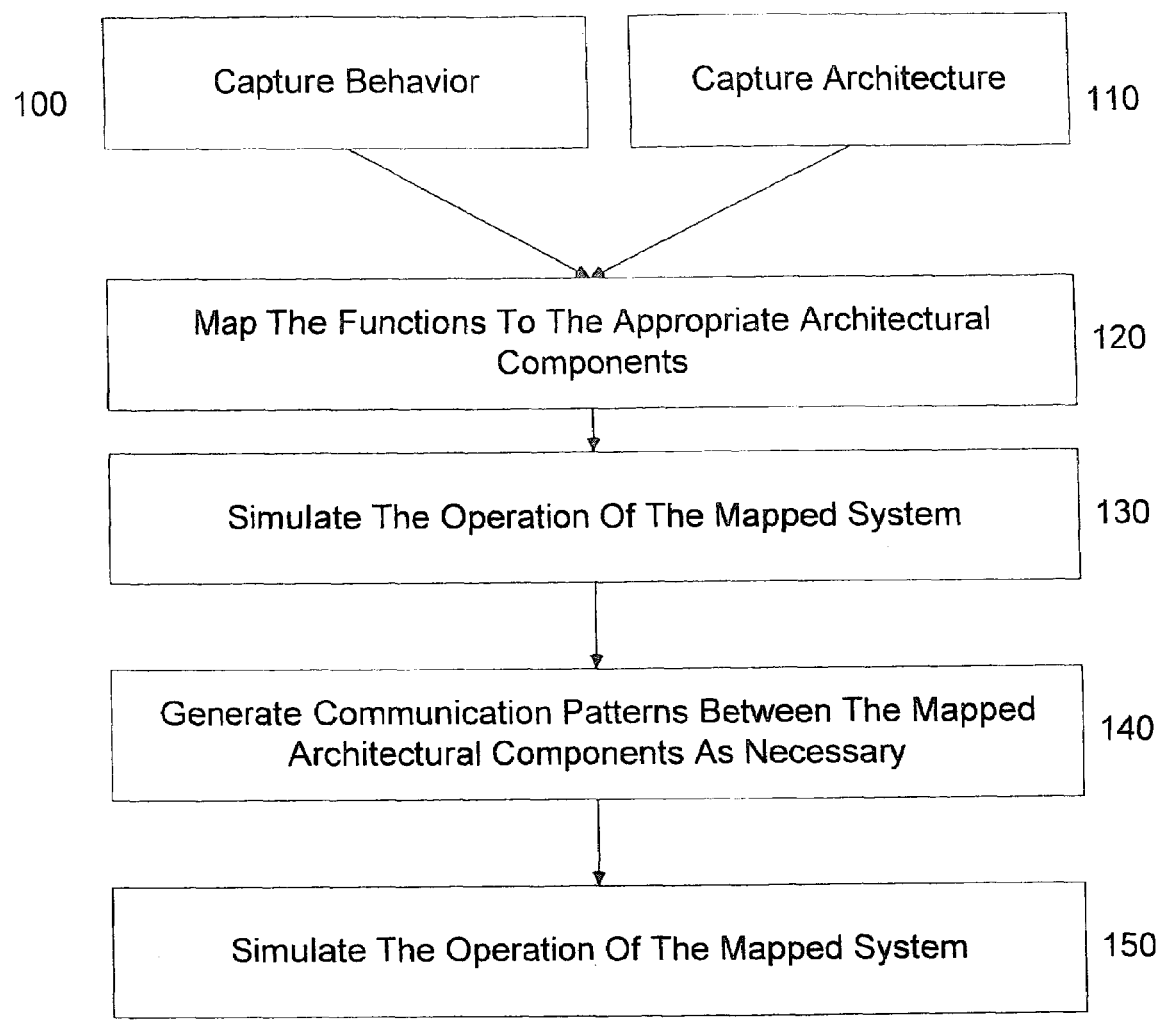
FIG. 2 is a flow chart of a method of generating a behavioral and performance model according to a presently preferred embodiment of the present invention.

Referring to FIG. 2, a plurality of behaviors are generated by a user, step 100. The behaviors can be input by the user as C++ objects, selected from a database of behaviors, composed hierarchically in block diagram, be input into dialog boxes, or otherwise generated. The behaviors describe the desired functions of the system that the designer wants the system to be able to perform.

A plurality of architecture components are generated by a user, step 110. The architecture components can be input, selected from a database of architectures, composed hierarchically in an architecture diagram, be input into dialog boxes or otherwise generated. As used herein, architectural components refers to a model of an architectural element, which is a realizable component of an actual system. Examples of architectural elements include busses, CPU's, Real Time Operating Systems (RTOS), Schedulers, ASICs, etc. The architectural components include a number of services that each relate to a specific function that is performed by the architectural element. For instance, a RTOS can be modeled by a scheduler application, a standard C Library, etc.

The behaviors are then partitioned into hardware and software by mapping the behavior instances to the appropriate architecture component (e.g. RTOS or ASIC), step 120. The user can now run a performance analysis of their system which models the impact of this particular partition, step 130. The user iterates the partitioning step until the system meets the performance requirements.

Once the partitioning is complete, the user can refine the mapped design by choosing communication patterns for the plurality of nets in behavior design, step 140. The communication patterns include the timing, speed and protocols that are required to carry out communication between the separate architectural components. After the communication patterns are chosen, operation of the behaviors can be simulated again, step 150. In this case, the performance simulation is more accurate because it models the performance impact of the communication as well as the computation. For example, communication between hardware and software may be register mapped or shared memory. The user iterates the mapping step until the system meets the performance requirements.

If, after simulation, the parameters returned are not within desired operational parameters, the designer can quite easily change any aspect of the mapped model. That is, architectural component types can be changed, architectural components can be added or removed, the connections between the various architectural components can be altered, and the mapping of behavior to architecture can be changed which in turn would alter the communication patterns.

Additionally, the designer can serially implement all the behaviors they desire in order to make sure they can be implemented within the performance constraints specified in the mapped design. This approach allows for an iterative design process, at a high level, which reduces the component level design work and greatly speeds up the design process.

Figure 3:
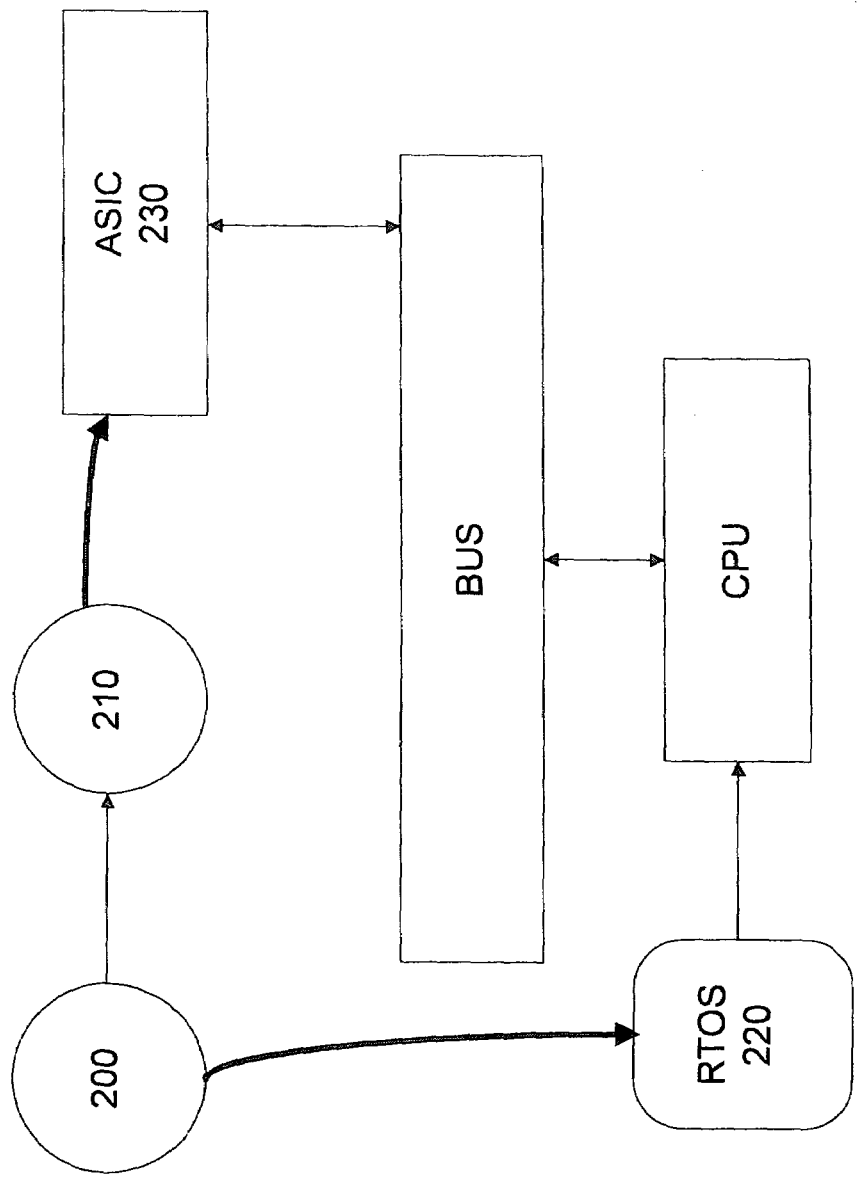
FIG. 3 is a diagram of a mapping procedure according to a presently preferred embodiment of the present invention.

Referring to FIG. 3, a source behavior 200 controls a destination behavior 210, which needs the instructions or information generated by the source behavior 200. In the mapped example of FIG. 3, the source behavior 200 is implemented by the RTOS 220 while the destination behavior 210 is to be implemented by the ASIC 230, such an example can be a compression initiation procedure, which is initiated by an RTOS 220 and performed by ASIC 230. The mapping of the source behavior 200 and the destination behavior 210 is determined by the function performed and is determine by the user.

Figure 4:
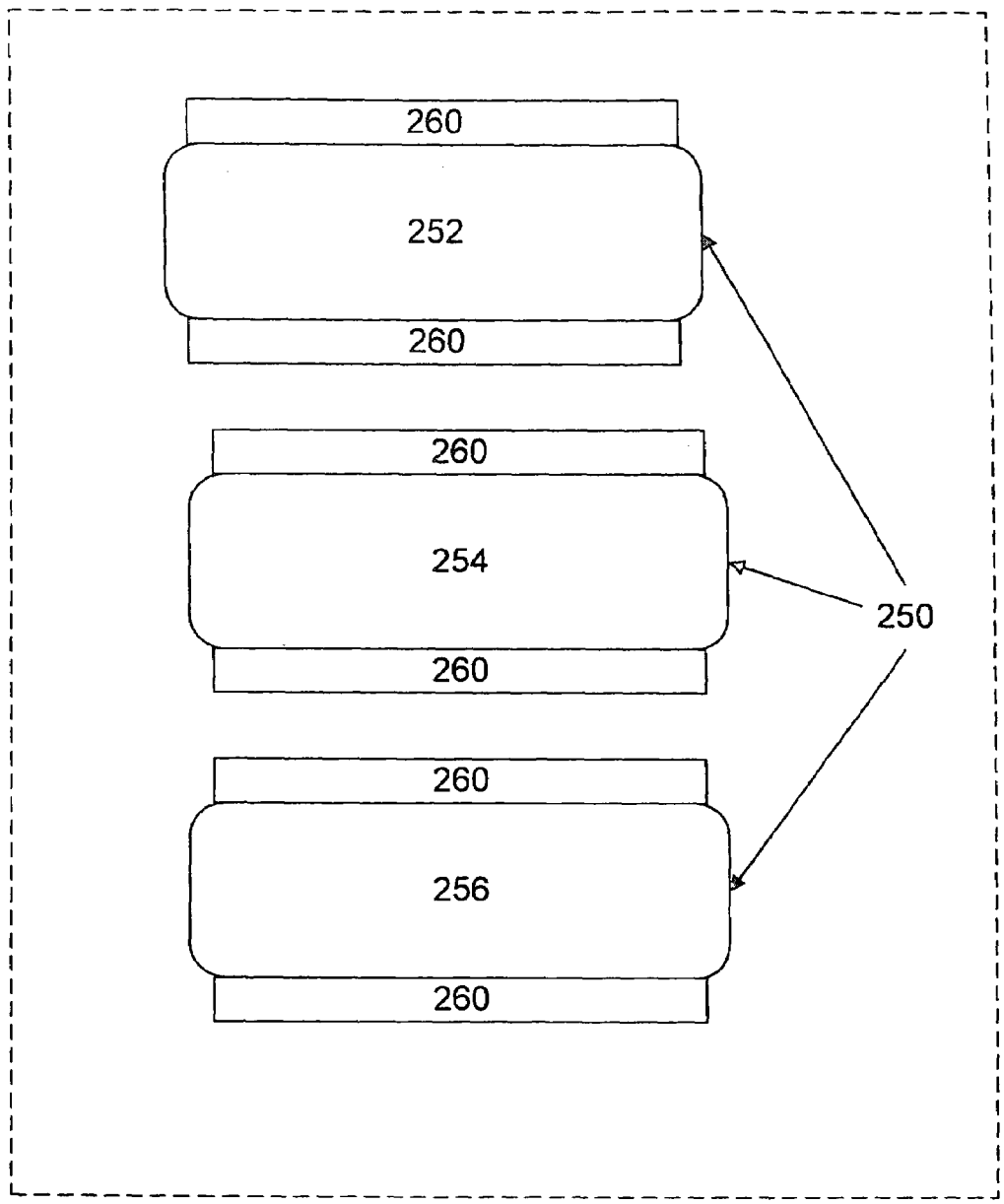
FIG. 4 is a diagram of an exemplary architectural component according to a presently preferred embodiment of the present invention.

Referring to FIG. 4, an architectural component, in this case a RTOS, comprises a plurality of services, e.g. C library 252, scheduler 254, and Mutex 256, etc. Each service corresponds to a different function that is performed by the architectural component. In this way each architectural component is broken into multiple functions, increasing modularity and promoting reusability of services between architecture components. For example, there are only a handful of scheduling algorithms which are used by all the RTOSes. A service for round robin scheduling could be defined once and used in many RTOS components. The services and their function can be determined based upon the architectural component specifications provided by the vendor that provides the architectural component that is being modeled.

It is presently preferred that each service is defined by a service declaration and one or more service definitions. A service declaration declares in a C++ header file one or more C++ functions. The service definition provides the body of the C++ function declared by the header file. The advantage of this approach is that C++ is a standard, object-oriented language which supports separation of function declaration and definition.

The service declarations for each architecture component are selected from a library or other database that is either provided by the manufacturer of the component represented by the architectural component or an industry-driven standard library or created by the system user. This approach promotes industry standards for modeling architecture components that can be mixed and matched; which in turn promotes exploration of architecture designs by the system designer.

The service definitions 260 for each architectural component are selected from a library or other database that is either provided by the manufacturer of the component represented by the architectural component or can be created by the system user. The advantage of this approach is that components from different vendors can work together as long as they implement services with matching APIs. In addition, if the definition is provided by the IP vendor, the system designer doesn't have to understand all the complicated details because they are encapsulated within the service. Another advantage of this approach is that many service definitions can be written to model different levels of performance accuracy while retaining the same interface. The system designer can easily and gradually move to higher levels of accuracy in their performance analysis and the design becomes more refined.

To follow the RTOS example, it may support the StandardCLibrary service. The service declares the function prototype for "memcpy" and "memset". The implementation of the service would define the functionality and performance impact of these two functions.

The function prototypes for memcpy and memset are as follows:

```
virtual vccAddress* memcpy(vccAddress* s1, const vccAddress* s2, size_t n, vccInstance*) = 0;
virtual vccAddress* memset(vccAddress* s, int c, size_t n, vccInstance*) = 0;
For still additional guidance, the presently preferred C++ code for memcpy and memset is as follows:
/***************************************************************
Name:          memcpy
Description: Copies n bytes from memory address s2 to s1. This
             implementation assumes that addresses lies on memory
             word boundaries. No actual data is designed to be
             stored or read. Memory transactions are generated for
             performance reasons only.
Return:        Always returns s1.
***************************************************************/
vccAddress* CPP_MODEL_IMPLEMENTATION::memcpy(vccAddress* to, const vccAddress* from, size_t n, vccInstance* inst)
{
    if (n == 0)
        return to;
    Init( );
    unsigned reqTrans = n / bytesPerWord_;
    reqTrans = ((reqTrans==0) ? 1 : reqTrans);
    unsigned remTrans = reqTrans;
theBegin:
    if (remTrans == 0) goto theEnd;
    {
        memAccess.reference(*from, bytesPerWord_, rwRead,inst,true);
        memAccess.reference(*to, bytesPerWord_, rwWrite,inst,true);
    }
    remTrans--;
    goto theBegin;
theEnd:
    return to;
}
/***************************************************************
Name:          memset
Description: Sets the first n bytes of memory at address s to the value
             of c (converted to an unsigned char). Memory transactions
             are generated for performance reasons only.
Return:        Always returns s;
***************************************************************/
vccAddress* CPP_MODEL_IMPLEMENTATION::memset(vccAddress* s, int c, size_t n, vccInstance* inst)
```

-continued

```
{
    if (n == 0)
        return s;
    Init( );
    vccAddress* to = s;
    unsigned remTrans = n;
theBegin:
    if (remTrans == 0) goto theEnd;
    {
        memAccess.reference(*to, bytesPerWord__, rwWrite,inst,true);
    }
    remTrans--;
    goto theBegin;
theEnd:
    return s;
}
```

Figure 5:
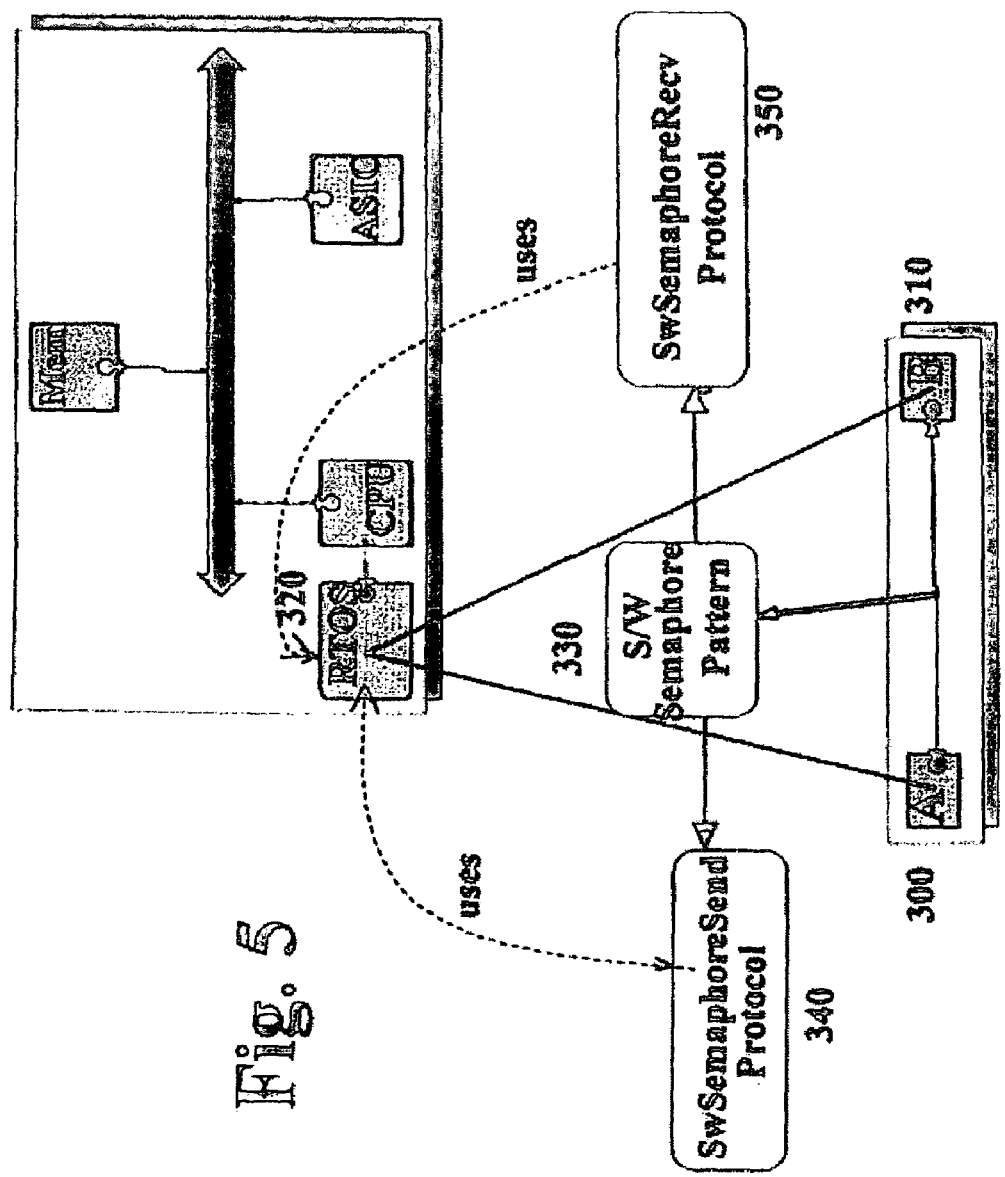
FIG. 5 is a diagram of a communication pattern according to a presently preferred embodiment of the present invention.

Referring to FIG. 5, an example of a communication pattern is depicted between two behavioral blocks 300 and 310 that is mapped to the appropriate architectural components, in this case RTOS 320. A communication arc between the two behavioral blocks 300 and 310 is mapped to the appropriate pattern, in this case Semaphore pattern 330. The Semaphore pattern 330 implements a communication protocol composed of a pair of pattern services 340 ("sender") and 350 ("receiver"), one for each end of the communication pattern 330. The "sender" service models the locking of the mutex, writing the data, unlocking the mutex and sending a trigger to the destination behavior. The "receiver" models locking the mutex, reading the data and unlocking the mutex.

It is presently preferred that the pattern services 340 and 350 are not directly mapped to architectural components. Instead the mapping of each pattern service 340 and 350 is implied by the mapping of the behavior block to an architectural block. That is, since the pattern services 340 and 350 implements or refines part of the behavior, it uses resources or services of the architectural component that implements that behavioral block 310 or 320. Pattern services use services of the architectural component of the system. In this example, the mutex locking and unlocking is supported by a service on the RTOS.

The implementation of the pattern services effect a certain sequence of events that propagate data from one behavior to another through architectural participants. One behavior "Posts" data to its output port and the second behavior uses the "Enabled" and "Value" functions on the input port to access this newly sent data. Patterns are a combination of "sender" and "receiver" patterns which implement the two sides of the communication. The "sender" service implements the "post" function and the "receiver" service implements the "Enabled" and "Value" functions. The pattern services are, presently preferred to be, separate services from the pattern itself so that they can be reused in other patterns. Each of the pattern services do not fully implement the protocol but instead make calls to services supported by the architecture. Each communication protocol is a stack of layers. The top layer, specifies the behavior required to implement the protocol functionality in terms of existing resources. The lower layers emulate the timing behavior of such resources (e.g. library of generic software functions, a CPU, or a bus).

Figure 6:
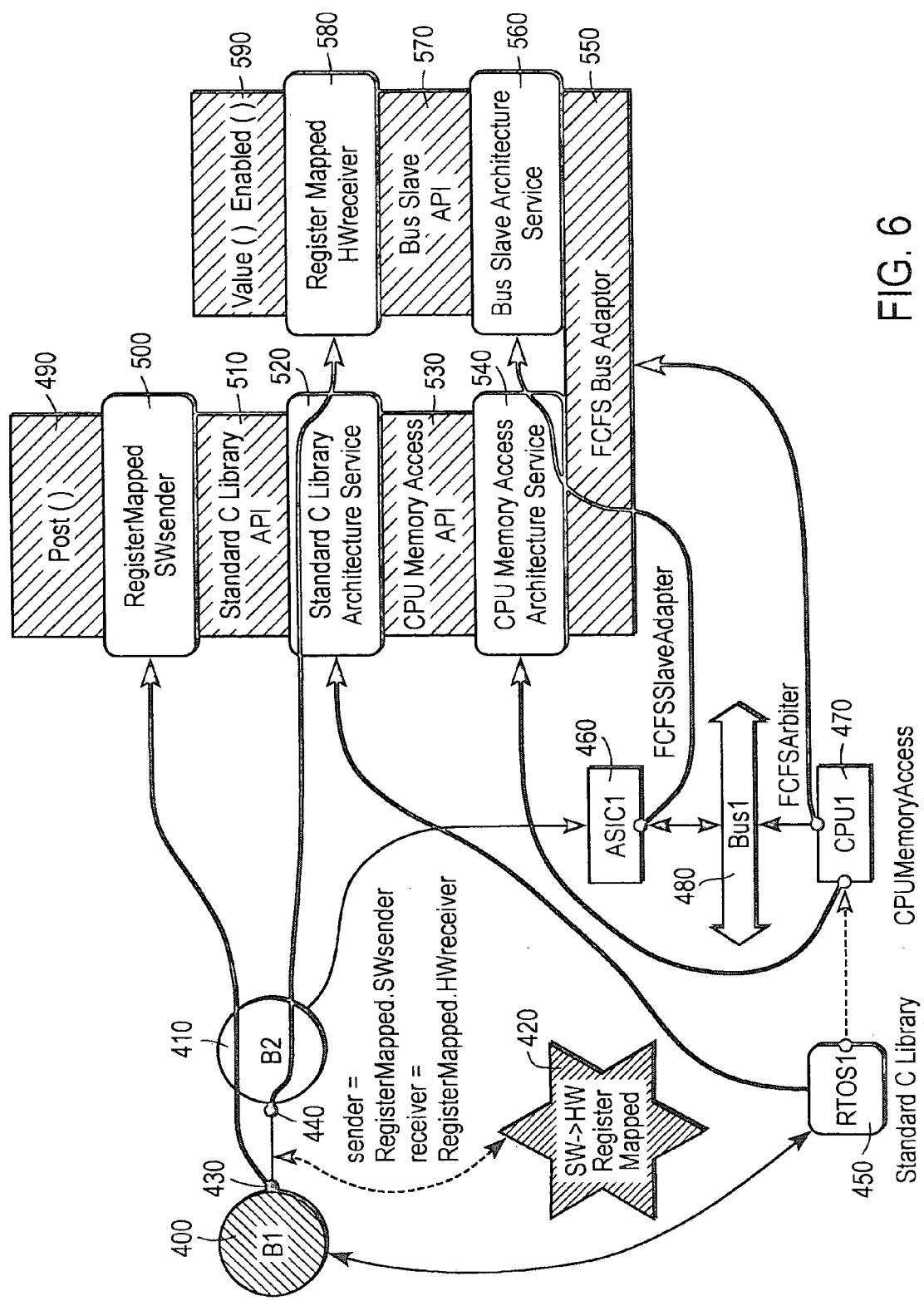
FIG. 6 is a diagram of a communication pattern with corresponding pattern and architectural component services according to preferred embodiment of the present invention.

Referring to FIG. 6, a first behavioral block 400 and a second behavioral block 410 are utilized to implement some user defined behavior. The first behavioral block 400 is mapped to an RTOS architectural component 450 while the second behavioral block 410 is mapped to an ASIC architectural component 460. The communication pattern 420 between the first behavioral block 400 and the second behavioral block 410 is then determined to be a registered mapped communication pattern and therefore the sender pattern service 430 and the receiver pattern service 440 are both register mapped pattern services. CPU architectural component 470 and bus architectural component 480 are also called in order to facilitate communication between the RTOS architectural component 450 and the ASIC architectural component 460, since the RTOS architectural component 450 is a software component that controls the CPU architectural component 470.

To start the communication pattern, a post function 490 is called from within the behavior component 400. The post function provides the input to the sender pattern service 500 of the communication pattern 420. The register mapped sender models the transfer of the data from the software to a register on the ASIC (to which the behavior component 410 is mapped). In this example, behavior component 410 is mapped to ASIC 460. The sender service implements the data transfer using the "memcpy" function provided by the RTOS "Standard C Library" service. Each service declares that it uses a set of service declarations and the service definitions of each service must be found on connected architecture components. The pattern sender service can use services provided by the architecture component to which the source behavior (400) is mapped. In this case, the Standard C Library is found on the RTOS 450. The RTOS provides the implementation of the standard C library service, which in this example uses a memory access interface to write data to the register on the ASIC. The memory access service definition is found on the CPU 470 because the RTOS can use services provided by the processor to which it is assigned. The CPU memory access service 540 uses the bus adapter model 550 which is found on the port of the CPU. The bus adapter model 550 uses the uses the bus arbiter service on the BUS architecture component 480, and once granted bus ownership it uses the slave adapter service 560 on the port of the ASIC architectural component 460, which is the service that models the bus communication of the ASIC. The slave adapter service 560 uses the slave service on the ASIC 460 to store the data in the local register. From the other side of the pattern, the register mapped receiver 580 implements the value and enable functions 590, using the slave service to retrieve the data written, thus completing the pattern protocol.

The advantage of this approach is that the communication patterns are based on the architecture topology with each of the components supplying modular, reusable services. This approach provides a process for architectural exploration at the system level.

Figure 7:
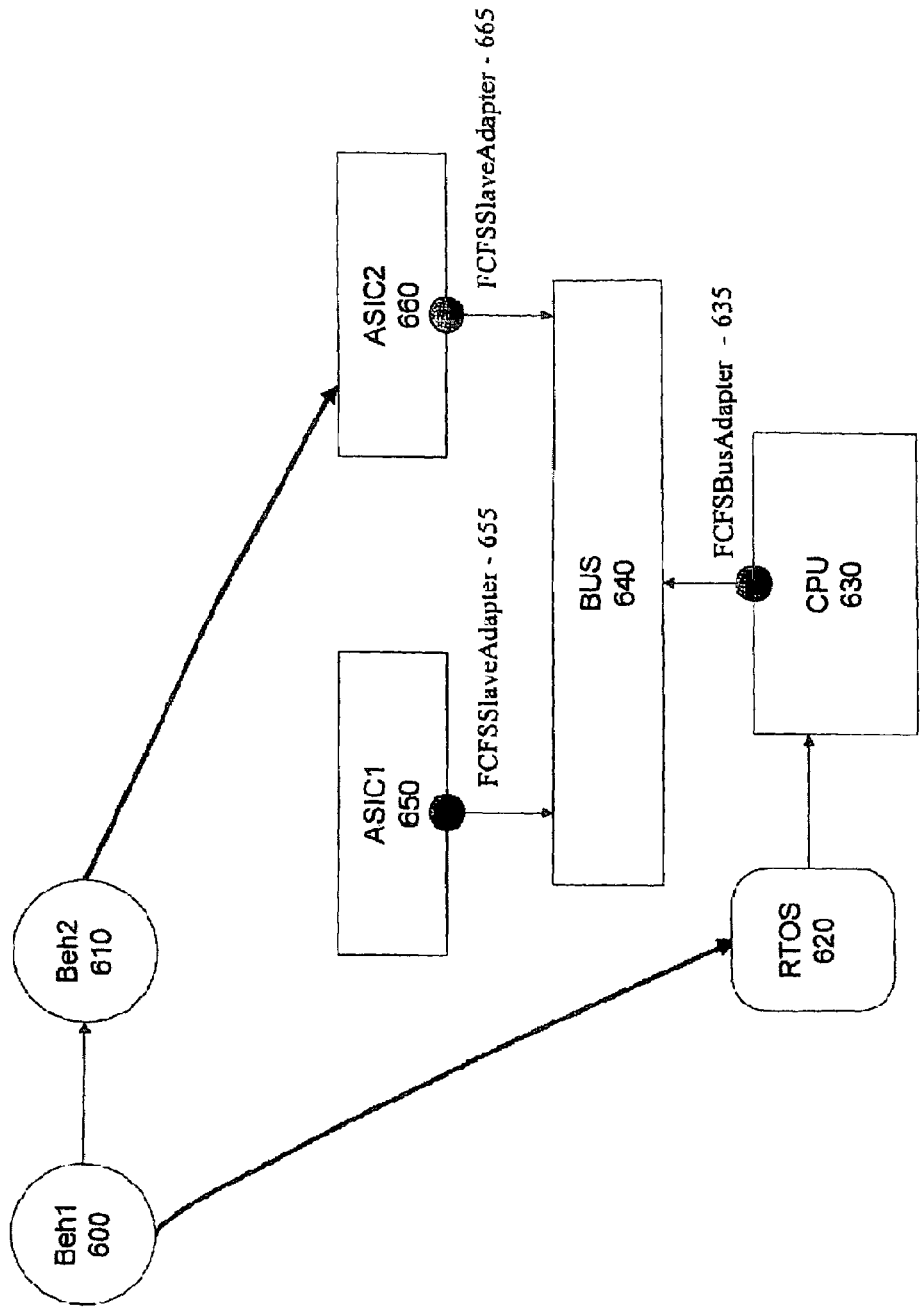
FIG. 7 is a diagram showing the interaction between services communicating across a bus according to a presently preferred embodiment of the present invention.

Searching for pattern services on connected architecture components works well when there is a single communication between components. A bus inherently violates this principle because it is a medium for multiple pairs of communications. Referring to FIG. 7, behavior 600 is mapped to an RTOS 620 and behavior 610 is mapped to ASIC 660. The communication pattern uses services on the RTOS, CPU, bus and the ASIC 660. A generic bus adapter 635 on the CPU needs to differentiate that this message should be sent to the slave adapter 665 on ASIC2, while other messages might be sent to other slave devices (ASICs) on the bus. The distinction can not rely on the search for a matching service definition, because each slave device will support the same slave bus adapter. It is presently preferred that a symbolic address be sent along with each bus transaction so that it can be directed to the correct slave adapter service. In this approach, the symbolic address consists of the architecture instance name and an offset. Each slave registers its slave adapter service by instance name with the bus registry. When a pattern sends a message it must provide an address of the message which can be quickly looked up in the registry to find the appropriate slave adapter. The pattern sender and receiver services must declare the message sequence required to complete the pattern protocol as path specifications, e.g.:

Path: <pathName> <sourceArchInst> <destArchInst> <offsetparam> <dataType>.

Sometimes the source and destination of each message is the architecture components to which the behaviors are mapped. For example, in the register mapped pattern, the sender sends data from the RTOS to ASIC2 and these are the architecture components to which beh1 and beh2 are mapped. In other scenarios, a third architecture component may participate in the message sequence. For example in a shared memory register mapped pattern, the data is first written to a RAM component. It is presently preferred, that the sourceArchInst and destArchInst can reference the keywords vccArchOfSrcBehav or vccArchOfDestBehav or can reference a parameter of the pattern service which can then be further exported to the pattern instance and specified by the end-user during the mapping process. In the latter scenario, the end-user selects the memory participant from the set of memories in the architecture diagram for each usage of a shared memory pattern. The dataType specifies whether the message sends the data on the net or just a trigger. This information is used to determine the performance impact on the bus because it accurately accounts for the size of the data being transferred. The advantage of this approach is that patterns can be reused across different architectures.

Figure 8:
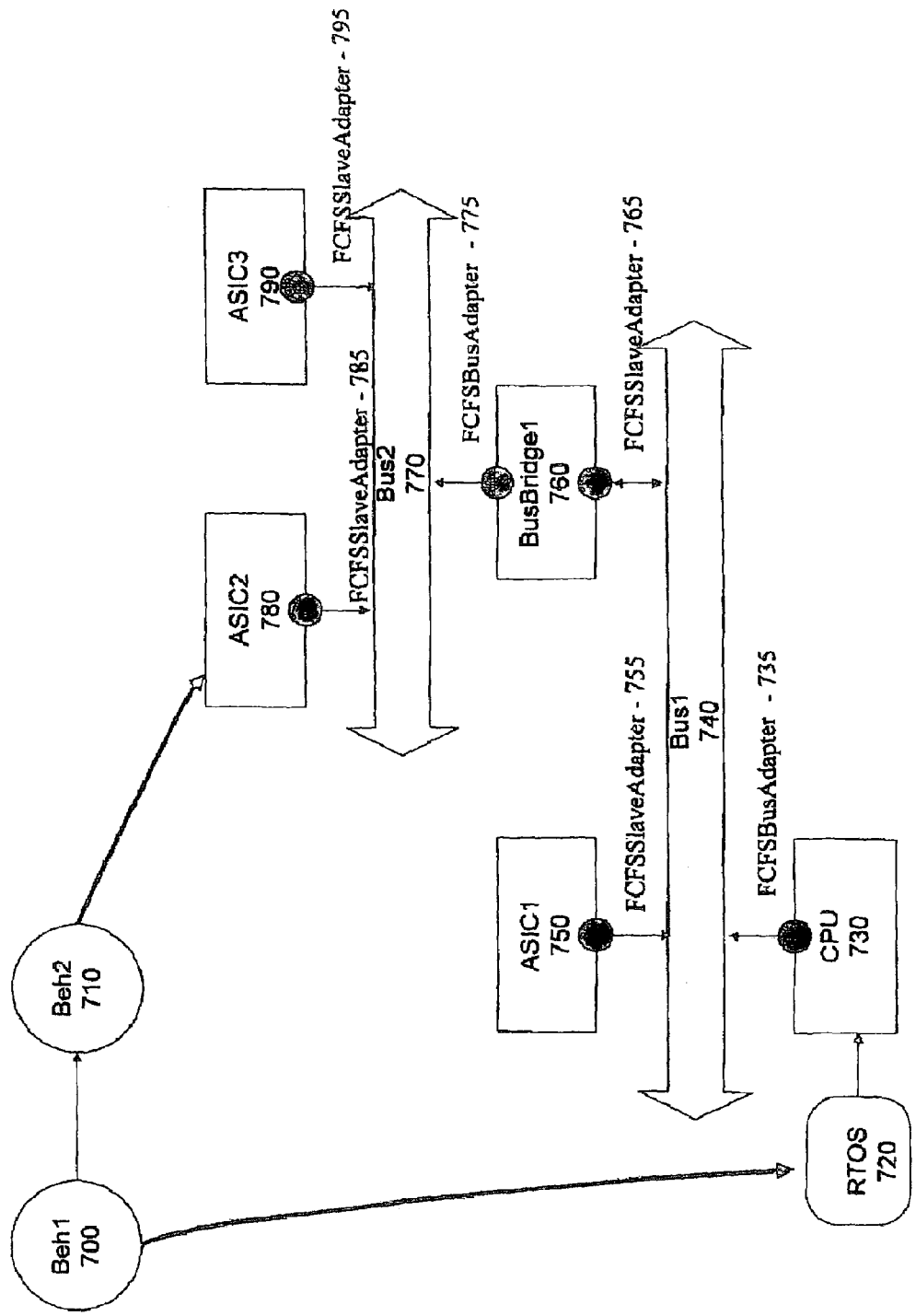
FIG. 8 is a diagram showing the interaction between services communicating across a bus bridge according to a presently preferred embodiment of the present invention.

Referring to FIG. 8, the behaviors are mapped to the RTOS 720 and ASIC2, 780. In this example, the message must be sent from RTOS across Bus1 740 through BusBridge1 760 across Bus2 770 and finally to ASIC2. The bus bridge facilitates conversion of bus transactions from Bus1 to Bus2. It is presently preferred that the bus bridge registers all slave services on Bus2 with Bus1 registry. The usage of architecture instances (which is unique across the architecture diagram) ensures that the slave services on Bus2 will not conflict with slave services on Bus1. As a result, the symbolic address will reference instance name "ASIC2" and the Bus1 registry will find the bus bridge slave adapter. It is also presently preferred that the bus bridge will have slave adapter 765 on one port and a bus master adapter 775 on a second port. The slave adapter 765 connected to bus1 will receive the bus request and then the bus master adapter on the second port will resend the request across bus2 for which ASIC2 will now handle the transfer. Since bus bridges may have more than 2 ports, it is also presently preferred that each slave port must identify via a port attribute the master port to which it resends the data. The advantage of this approach is that an architecture diagram can be easily extended or reorganized around busses and bridges to optimize the overall system performance.

A protocol registry which is a database of patterns that can be searched using some key is presently preferred to be utilized so that once the behavior components are mapped all that is required by the system designer is to select from a list of patterns. A description of some of the presently preferred patterns is described herein for the purposes of example only and is not intended to be limiting in any way.

The patterns of communication are arranged in basic groups, depending on whether the implementation chosen for the sender/receiver is an ASIC (HW), a separate SW task (SW inter-task), or within the same SW task (SW intra-task), and whether the communication only deals with transmitting the presence of the event (Trigger) or data is also involved. For each group there is a choice of possible patterns:

| | |
|---|---|
| 1) HW—HW: | (a) Direct Connect, (b) Register Mapped, (c) Shared Memory: |
| 2) HW—HW Trigger: | (a) Direct Connect, (b) Register Mapped |
| 3) HW—SW: | (a) Interrupt Register Mapped, (b) Interrupt Shared Memory, (c) Polling Register Mapped, (d) Polling Shared Memory |
| 4) HW—SW Trigger: | (a) Interrupt, (b) Polling Register Mapped, (c) Polling Shared Memory |
| 5) SW—HW: | (a) Register Mapped, (b) Shared Memory |
| 6) SW—HW Trigger: | (a) Register Mapped |
| 7) SW—SW Inter-task: | (a) Unprotected, (b) Semaphore Protected, (c) Uninterruptable Protected |
| 8) SW—SW Inter-task Trigger: | (a) Unprotected |
| 9) SW—SW Intra-task: | (a) Unprotected |
| 10) SW—SW Intra-task Trigger: | (a) Unprotected. |
| 11) SW—>Memory | (a) SWDirectMemoryAccess (b) SWDMAAccess |
| 12) HW—>Memory | (a) HWDirectMemoryAccess (b) HWDMAAccess |
| 13) SW—>Timer | (a) SWVirtualTimer |
| 14) HW—>Timer | (a) ASICInternalTimer |

The advantage of grouping the patterns is that the communication arcs can be categorized into each of the groups based on the mappings of the behavior components as well as the size of the data type on the arc. Once the user selects a default pattern for each of the basic groups the unmapped arcs can be automatically assigned to these defaults saving time in the mapping process. The user can always explicitly map or change the mapping to a different choice but the defaults should be applicable a large percentage of the time.

Figure 9:
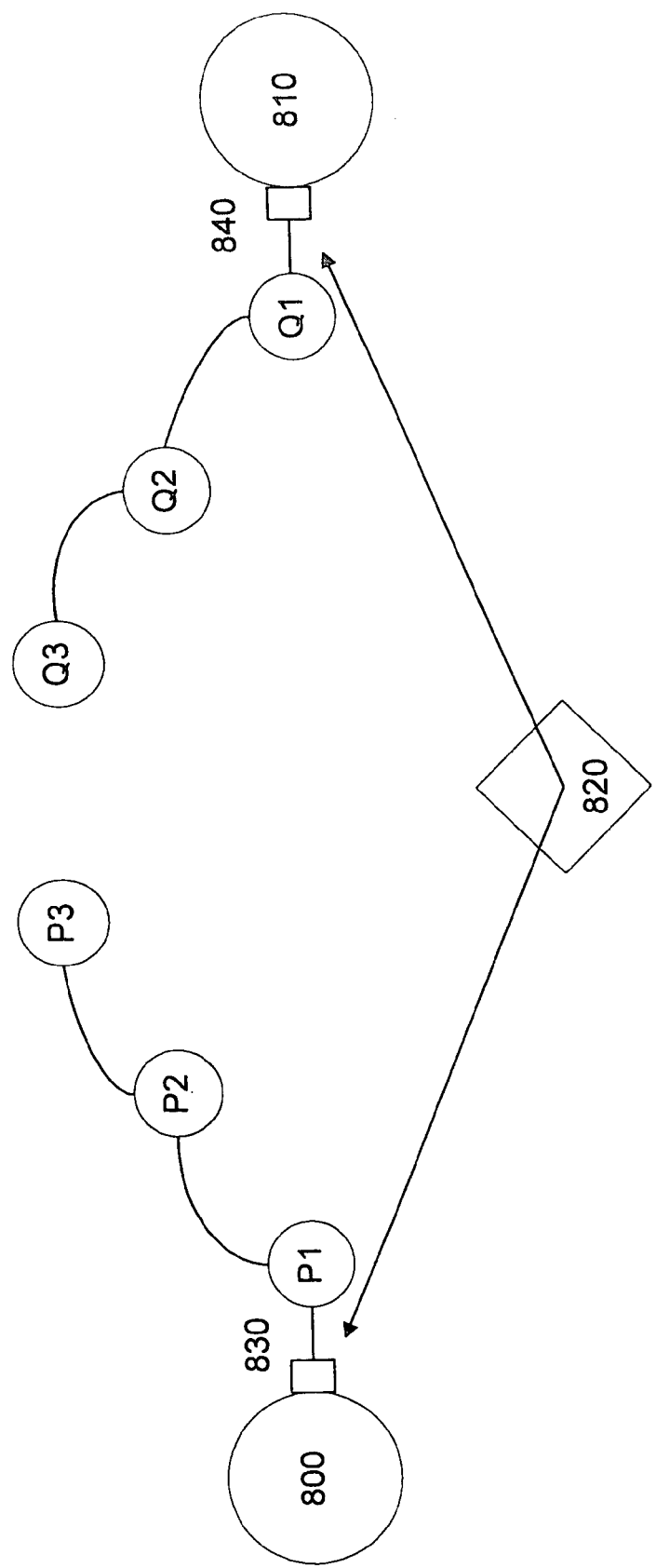
FIG. 9 is a diagram showing the interaction between performance models of services according to a presently preferred embodiment of the present invention.

Referring to FIG. 9, a first behavior block 800 sends an event to a second behavioral block 810 using a communication pattern 820. The communication pattern 820 comprises services P1 . . . Pn on the sender's side and services Q . . . Qn on the receiver side. An output port 830, in the first behavior block 800, and an input port in second behavior block 810 begin and terminate the communication pattern 820. The control flows of the communication pattern 820 is as follows: the delay model of first behavior block 800 calls the behavioral block 800, which calls the function Post which is implemented by a function in P1. P1 calls some function of P2, P2 calls some function of P3 etc. At the end of the implementation of Post there is a call to an input change function that posts the event to the second behavioral block 810 with the required delay. This triggers, at a later time, the delay model of second behavioral block 810, which first calls the top receiver pattern service Q1 to set the value and event buffers in the instance of Q1, and then calls the appropriate service of the second behavioral block 810 which calls an enable function which in turn calls some function of Q1. Q1 calls some function of Q2, Q2 calls some function of Q3, etc. until Enabled( ) returns a result. The process may be repeated for any additional values and operations. It should be noted that the delay model as referred to herein is the delay of the architectural component performing the behavior, due to scheduling or buffering or the like.

It is presently preferred, as depicted in FIG. 9, that a communication pattern 820 is bound to a port, e.g. port 830 or 840, rather than to a net. In the case of a net with multiple fanouts, each destination port may be associated with a different communication pattern although it is presently preferred that nets from each architectural component use the same communication pattern for all fanouts. In a communication net with N fanouts each using a different communication pattern, the call to the post function in the behavioral block is going to be implemented as a sequence of N calls to the various implementations of the post function for each of the communication patterns.

This preferably requires an intermediate layer of code between the sender's behavioral block and the sender's top pattern service. That is, the implementation of the post function called by the behavior model should be a loop over the fanouts, and for each of them it will call the implementation of the post function provided by the service used by the pattern associated to the fanout. In the simulation, a C++ behavior block calls the implementation of the post function in the service directly. There is a code layer in the pattern that received the post from the models and then unravels it out to each of the patterns. This is performed inside a specific service which will receive the list of actual services, one per fanout, that it needs to call. This dispatcher service may be dropped when only one communication pattern is used on all fanouts of a net.

Referring again to FIG. 9, the data transmission from the post function 830 to the value function 840 in the simulation is inherently safe as it is performed atomically by a call to input changed function. The simulation of the finer details of the transfer only deals with the timing aspects, not the content.

While the embodiments, applications and advantages of the present inventions have been depicted and described, there are many more embodiments, applications and advantages possible without deviating from the spirit of the inventive concepts described and depicted herein. The invention should only be restricted in accordance with the spirit of the claims appended hereto and is not restricted by the preferred embodiments, specification or drawings. For example, the patterns discussed represent the communication between behavior ports. The behaviors may also communicate with behavior memories and timers. Patterns are also appropriate for modeling the performance impact of these communications based on the architecture platform.

What is claimed is:

1. A computer implemented method of modeling an electronic system having both hardware and software elements, comprising,
    capturing a plurality of behaviors that correspond to operations performed by the system being modeled;
    capturing a plurality of hardware and software architectural components the plurality being contained within an architectural platform;
    mapping each of the captured behaviors of the plurality of behaviors to a selected architectural component to perform the behavior;
    recognizing and capturing communication patterns among the architectural components that require communication among them in order to perform the behaviors; and
    mapping each instance of communication between behaviors to an instance of the captured pattern; wherein:
    the architectural components include software and hardware architectural blocks; and
    the method further comprising the steps of,
    re-mapping portions of the behavioral blocks to different architectural blocks and causing implementations of behavior to move between hardware and software.

2. The method according to claim 1, wherein the step of re-mapping comprises iteratively re-mapping until the modeled system meets specific performance requirements.

3. The method according to claim 1, wherein said step of re-mapping is performed to alter the communications patterns.

4. The method of claim 1 wherein each architectural component comprises a plurality of services each service corresponding to a particular function of the architectural component.

5. The method of claim 4 wherein each service comprises a declaration and a definition corresponding to the interface and body of the service, respectively.

6. The method of claim 5 wherein each service definition uses other services.

7. The method of claim 1 further comprising a step of partitioning each behavior of the plurality of behaviors that are captured as either a hardware or software behavior.

8. The method of claim 1 further comprising modifying the plurality of architecture components that are contained in an architecture while maintaining previously captured behavior mappings and communication patterns.

9. The method of claim 1 further comprising simulating operation of the electronic system when performing the plurality of behaviors utilizing the architecture services of the mapped behaviors and optionally the pattern services that were selected.

10. The method of claim 9 wherein utilizing the architecture services can be successively refined where additional design decisions are made causing the performance model to become more accurate.

11. A computer implemented method of modeling an electronic system having both hardware and software elements, comprising:
    capturing a plurality of behaviors that correspond to operations performed by the system being modeled;
    capturing a plurality of hardware and software architectural components the plurality being contained within an architectural platform;
    mapping each of the captured behaviors of the plurality of behaviors to a selected architectural component to perform the behavior;

recognizing and capturing communication patterns among the architectural components that require communication among them in order to perform the behaviors; and mapping each instance of communication between behaviors to an instance of the captured pattern;

wherein the architectural components are high level architectural components and not component level design items.

12. The method according to claim 11, wherein at least on the high level architectural components is one of a series of Real Time Operating System (RTOS) scheduling components.

13. The method of claim 11 further comprising at least one member of a group consisting of reuse of services in other architecture components and reuse of architecture components in other architecture platforms or reuse of architecture platforms in other electronic systems.

14. The method of claim 11 wherein said capturing communication pattern step comprises a plurality of services each service uses other service declarations that are supported by the architecture component to which the behavior is mapped.

15. A computer implemented method of modeling an electronic system having both hardware and software elements, comprising:

capturing a plurality of behaviors that correspond to operations performed by the system being modeled;

capturing a plurality of hardware and software architectural components the plurality being contained within an architectural platform;

mapping each of the captured behaviors of the plurality of behaviors to a selected architectural component to perform the behavior;

recognizing and capturing communication patterns among the architectural components that require communication among them in order to perform the behaviors; and mapping each instance of communication between behaviors to an instance of the captured pattern wherein the communication patterns include each of timing, speed and protocols that are required to carry out communication between the separate architectural components.

16. The method of claim 15 wherein the step of capturing the architectural platform comprises selecting a performance model for each of the plurality of architectural components wherein the services of one architectural component uses other services that are topologically connected in the platform.

17. The method of claim 15 further comprising associating at least one behavior of the plurality of behaviors with a new architectural component and recognizing and capturing one or more new communication patterns while maintaining other previously captured communication patterns.

18. The method of claim 15 further comprising modifying at least one architecture component of the plurality of architecture components in the platform while maintaining associations amongst the other architecture components and patterns of communication to and from the modified component, this modification can be exchange of component for another component or a tweak to the parameter settings or a different selection of performance model.

19. A computer implemented method, of modeling an electronic system having both hardware and software elements, comprising:

capturing a plurality of behaviors that correspond to operations performed by the system being modeled;

capturing a plurality of hardware and software architectural components the plurality being contained within an architectural platform;

mapping each of the captured behaviors of the plurality of behaviors to a selected architectural component to perform the behavior;

recognizing and capturing communication patterns among the architectural components that require communication among them in order to perform the behaviors; and mapping each instance of communication between behaviors to an instance of the captured pattern;

wherein the step of mapping each instance of communication comprises mapping each instance of communication to a semaphore pattern that includes a sender and receiver pair of pattern services representing each end of the communication.

20. The method of claim 19 further comprising modifying at least one behavior of the plurality of behaviors or associating at least one behavior with a new appropriate architectural component while maintaining associations among the other behaviors with previously mapped architectural components.

21. The method of claim 19 further comprising changing the selection of one or more pattern mappings while maintaining other previously captured communication patterns.

22. The method of claim 19 further comprising reuse of patterns in other electronic systems with variations on the architecture platform.

23. The method according to claim 19, wherein the sender pattern service models locking of a mutex, writing data, unlocking the mutex, and sending a trigger.

24. The method according to claim 23, wherein the receiver pattern service models locking the mutex, reading the data, and unlocking the mutex.

25. The method according to claim 19, further comprising the step of:

selecting a group of patterns from a plurality of pattern groups based on an implementation chosen for the sender receiver pair;

selecting a pattern service to be mapped to each instance of communication from the selected group of patterns;

wherein the plurality of pattern groups include pattern groups for each of ASICs, inter-task software, intra-task software, event trigger transmitting.

26. The method according to claim 25, wherein the patterns in each groups comprise:

| | |
|---|---|
| HW-HW | (a) Direct Connect, (b) Register Mapped, (c) Shared Memory |
| HW-HW Trigger | (a) Direct Connect, (b) Register Mapped |
| HW-SW | Interrupt Register Mapped, (b) Interrupt Shared Memory, (c) Polling Register Mapped, (d) Polling Shared Memory |
| HW-SW Trigger | (a) Interrupt, (b) Polling Register Mapped, (c) Polling Shared Memory |
| SW-HW | (a) Register Mapped, (b) Shared Memory |
| SW-HW Trigger | (a) Register Mapped |
| SW-SW Inter-task | (a) Unprotected, (b) Semaphore Protected, (c) Uninterruptable Protected |
| SW-SW Inter-task Trigger | (a) Unprotected |

-continued

| | |
|---|---|
| SW-SW Intra-task | (a) Unprotected |
| SW-SW Intra-task Trigger | (a) Unprotected |
| SW->Memory | (a) SWDirectMemoryAccess (b) SWDMAAccess |
| HW->Memory | (a) HWDirectMemoryAccess (b) HWDMAAccess |
| SW->Timer | (a) SWVirtualTimer |
| HW->Timer | (a) ASICInternalTimer |

27. The method according to claim 26, further comprising the step of:

categorizing each of the communications into one of the groups based on mappings of the behavior components and size of data to be communicated.

28. A system for creating a behavioral model of an electronic system having hardware and software components, comprising:

a plurality of architectural components, each of the architectural components corresponding to a component capable of being implemented as part of the electronic system; and means for generating communication patterns between the architectural components that require communication between them in order to perform user specified behaviors; each communication pattern including communication between any intervening architectural components needed to communicate between architectural components carrying out the behaviors;

wherein the architectural components are high level architectural components and not component level design items, wherein the behavioral model is created.

29. A performance level computer implement model of the communications between behaviors of an electronic system having hardware and software components, the model comprising:

an application programming interface for a first behavior that provides data to be transferred to one or more destination behaviors;

a first service that implements the application programming interface that models the performance of the communication protocol, the first service being among a plurality of services supported by the pattern to which the behavior communication is mapped;

one or more application programming interfaces used by the first service to model performance of the architecture platform, the application interfaces being among a plurality of service declarations supported by the symbol of the architectural component to which the first behavior is mapped;

a supported service declaration on the symbol of the architecture component by a service definition, the service definition being among a plurality of service definitions specified by the performance model of the architecture component;

a second application interface that represents a function to be performed by a second architectural component topologically connected to the first component of the electronic system, the second service being one a plurality of second services each corresponding to a function capable of being performed by the second architectural component;

an input application interface on the destination behavior that receives output information of the performance level computer implemented model of the electronic system, thereby completing a communication from source behavior to destination behavior, wherein the model is configured to, capture a plurality of behaviors that correspond to operations performed by the system being modeled, capture a plurality of hardware and software architectural components the plurality being contained within an architectural platform, map each of the captured behaviors of the plurality of behaviors to a selected architectural component to perform the behavior, recognize and capture communication patterns among the architectural components that require communication among them in order to perform the behaviors, and map each instance of communication between behaviors to an instance of the captured pattern and re-map portions of the behavioral blocks to different architectural blocks and causing implementations of behavior to move between hardware and software.

* * * * *